(12) United States Patent
Kim et al.

(10) Patent No.: US 11,701,693 B2
(45) Date of Patent: Jul. 18, 2023

(54) SUBSTRATE PROCESSING DEVICE COMPRISING DOOR UNIT HAVING INCLINED SURFACE

(71) Applicant: KCTECH CO., LTD., Gyeonggi-do (KR)

(72) Inventors: Hyung Chul Kim, Gyeonggi-do (KR); Dong Hwa Lee, Gyeonggi-do (KR); You Sun Jung, Busan (KR)

(73) Assignee: KCTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 17/781,700

(22) PCT Filed: Nov. 5, 2020

(86) PCT No.: PCT/KR2020/015388
§ 371 (c)(1),
(2) Date: Jun. 1, 2022

(87) PCT Pub. No.: WO2021/112417
PCT Pub. Date: Jun. 10, 2021

(65) Prior Publication Data
US 2023/0001462 A1    Jan. 5, 2023

(30) Foreign Application Priority Data

Dec. 4, 2019    (KR) .................. 10-2019-0159857

(51) Int. Cl.
*H01L 21/67* (2006.01)
*B08B 13/00* (2006.01)
*B08B 7/00* (2006.01)

(52) U.S. Cl.
CPC ............ *B08B 13/00* (2013.01); *B08B 7/0021* (2013.01)

(58) Field of Classification Search
CPC .............................. B08B 13/00; B08B 7/0021
See application file for complete search history.

(56) References Cited

U.S. PATENT DOCUMENTS

2013/0029282 A1* 1/2013 Park .................. H01L 21/67126
312/109

FOREIGN PATENT DOCUMENTS

| JP | 2003532842 | 11/2003 |
|----|------------|---------|
| JP | 2013041711 | 2/2013 |
| JP | 2013131729 | 7/2013 |
| KR | 101027325 | 4/2011 |
| KR | 20130014310 | 2/2013 |
| KR | 20180045961 | 5/2018 |
| KR | 20190070507 | 6/2019 |

OTHER PUBLICATIONS

Machine translation of JP2003532842 (Year: 2003).*

* cited by examiner

*Primary Examiner* — Erin F Bergner
(74) *Attorney, Agent, or Firm* — JCIPRNET

(57) ABSTRACT

The substrate processing device according to one embodiment may comprise: a chamber unit provided with a processing space therein and comprising an inclined chamber surface having an opening; a door unit comprising an inclined door surface, which corresponds to the inclined chamber surface, and capable of being coupled to the chamber unit; and a door driving unit for driving the door unit so as to open/close the processing space.

14 Claims, 7 Drawing Sheets

SUBSTRATE PROCESSING DEVICE COMPRISING DOOR UNIT HAVING INCLINED SURFACE

TECHNICAL FIELD

The following description relates to a substrate processing apparatus including a door having an inclined surface.

BACKGROUND ART

In general, semiconductors are manufactured by iteratively performing a series of processes, such as lithography, deposition, and etching. Contaminants, such as various particles, metal impurities, or organic materials, remain on a surface of a substrate of a semiconductor due to the iterative processes. Due to the contaminants on the substrate, the semiconductor may be less reliable, and thus, to remove the contaminants, a process of cleaning a substrate in a manufacturing process of a semiconductor is required.

Recently, a substrate processing process using a supercritical fluid has been adopted. In the processing process using the supercritical fluid, high pressure is required to be formed inside a processing space to satisfy a condition of the supercritical fluid. To withstand the high pressure formed inside the processing space, a method of clamping a chamber and a door has been used. However, although the chamber and the door are clamped, there is a problem that the high pressure formed inside the processing space pushes the door and the like and while the door is pushed, components are grounded due to friction between the components. Accordingly, there is a demand for a substrate processing apparatus having a structure that may effectively withstand the high pressure formed inside the processing space.

The above description is information the inventor(s) acquired during the course of conceiving the present disclosure, or already possessed at the time, and is not necessarily art publicly known before the present application was filed.

DISCLOSURE OF THE INVENTION

Technical Goals

An aspect provides a substrate processing apparatus for effectively withstanding high pressure formed inside a processing space.

An aspect provides a substrate processing apparatus for minimizing a grinding issue due to friction between components.

Technical Solutions

According to an aspect, there is provided a substrate processing apparatus including a chamber unit provided with a processing space therein and including an inclined chamber surface having an opening, a door unit including an inclined door surface, which corresponds to the inclined chamber surface, and configured to be coupled to the chamber unit, and a door driving unit for driving the door unit so as to open/close the processing space.

An upper surface of the door unit may include a protrusion protruding upward, and the chamber unit may include a recess formed in a corresponding shape for inserting the protrusion.

One surface of the protrusion may include at least a portion of the inclined door surface.

The substrate processing apparatus may further include a clamp unit enclosing at least a portion of the chamber unit and the door unit when the chamber unit is coupled to the door unit.

The clamp unit may include a lower clamp body contacting the door unit, an upper clamp body disposed on an upper side of the lower clamp body by being spaced apart, and a side clamp body for connecting both sides of the lower clamp body to both sides of the upper clamp body.

The door unit may include a clamp insert groove inwardly recessed in a counter surface to the chamber unit, for inserting the lower clamp body.

An upper surface of the clamp insert groove may be downwardly inclined in a moving direction of the clamp unit.

An upper surface of the lower clamp body may be downwardly inclined in the moving direction of the clamp unit to correspond to the upper surface of the clamp insert groove.

The clamp unit may include a clamp uneven portion formed on a lower surface of the upper clamp body.

The chamber unit may include a chamber uneven portion formed on an upper surface of the chamber unit to be coupled to the clamp uneven portion.

The clamp unit may include an inclined connecting part formed in an inclined surface at a connection portion in which the side clamp body is connected to at least one of the lower clamp body and the upper clamp body.

At least one of the door unit and the chamber unit may include an inclined chamfer formed in an inclined surface at a corner, for inserting the inclined connecting part.

The substrate processing apparatus may further include a sealing unit installed in a contact portion of the door unit and the chamber unit along a circumference of the opening.

The sealing unit may include a U-shaped sealing member and is disposed to connect a U-shaped space to the processing space.

The door driving unit may drive the door unit in a vertical direction.

The substrate processing apparatus may further include a clamp driving unit for driving the clamp in a front-rear direction.

The substrate processing apparatus may further include a pressurizer for pressing the door unit in a constant direction for close contact of the chamber unit and the door unit.

EFFECTS

A substrate processing apparatus according to an example embodiment may effectively withstand high pressure formed inside a processing space.

A substrate processing apparatus according to an example embodiment may minimize a grinding issue due to friction between components.

The effects of the substrate processing apparatus are not limited to the above-mentioned effects, and other unmentioned effects can be clearly understood from the above description by those having ordinary skill in the technical field to which the present disclosure pertains.

BEST MODE FOR CARRYING OUT THE INVENTION

Figure 1:
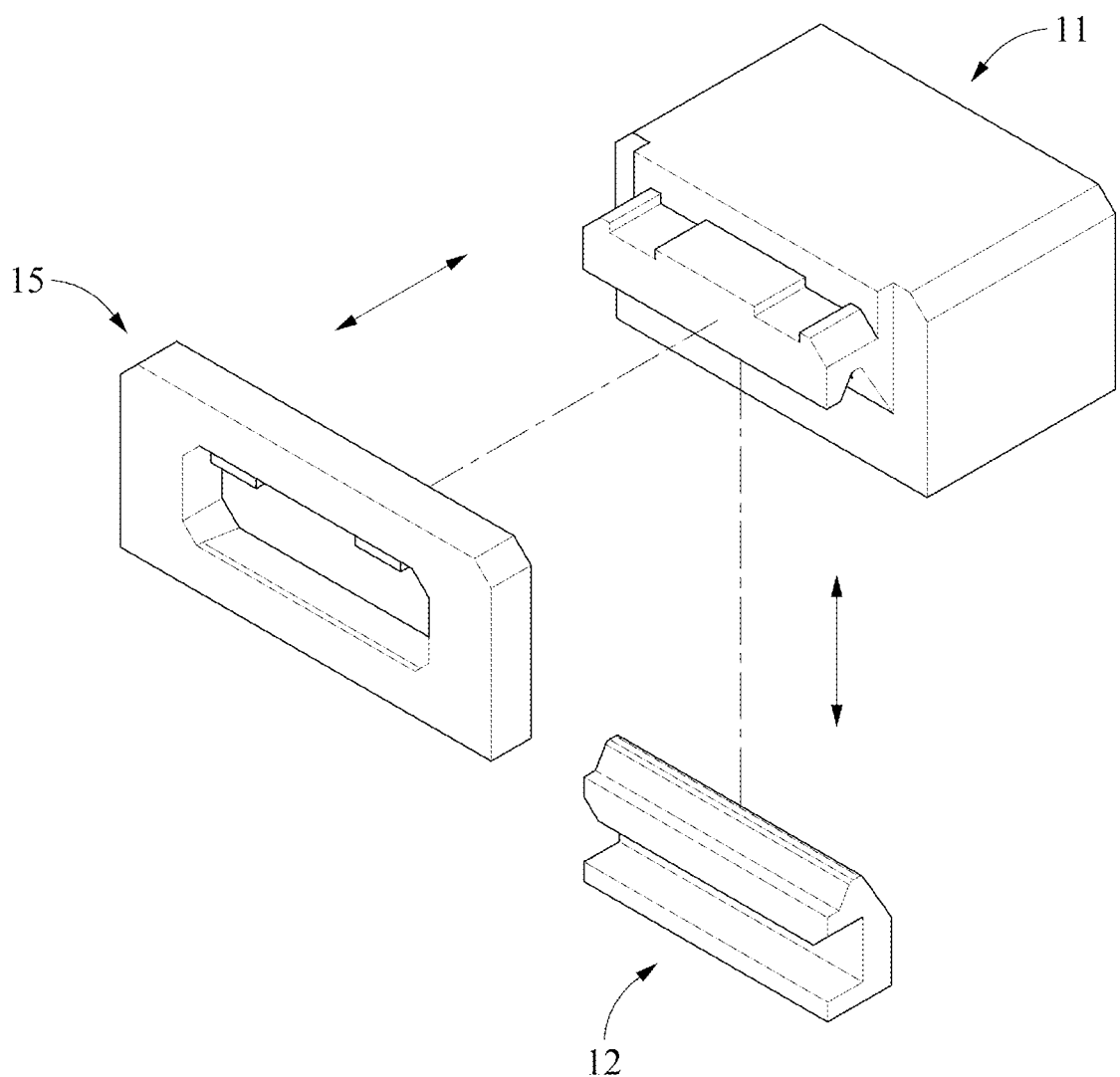
FIG. 1 is an exploded perspective view of a substrate processing apparatus according to an example embodiment.

Hereinafter, embodiments of the present disclosure will be described with reference to the accompanying drawings. Regarding the reference numerals assigned to the components in the drawings, it should be noted that the same components will be designated by the same reference numerals, wherever possible, even though they are shown in different drawings. Also, in the description of the embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

Figure 2:
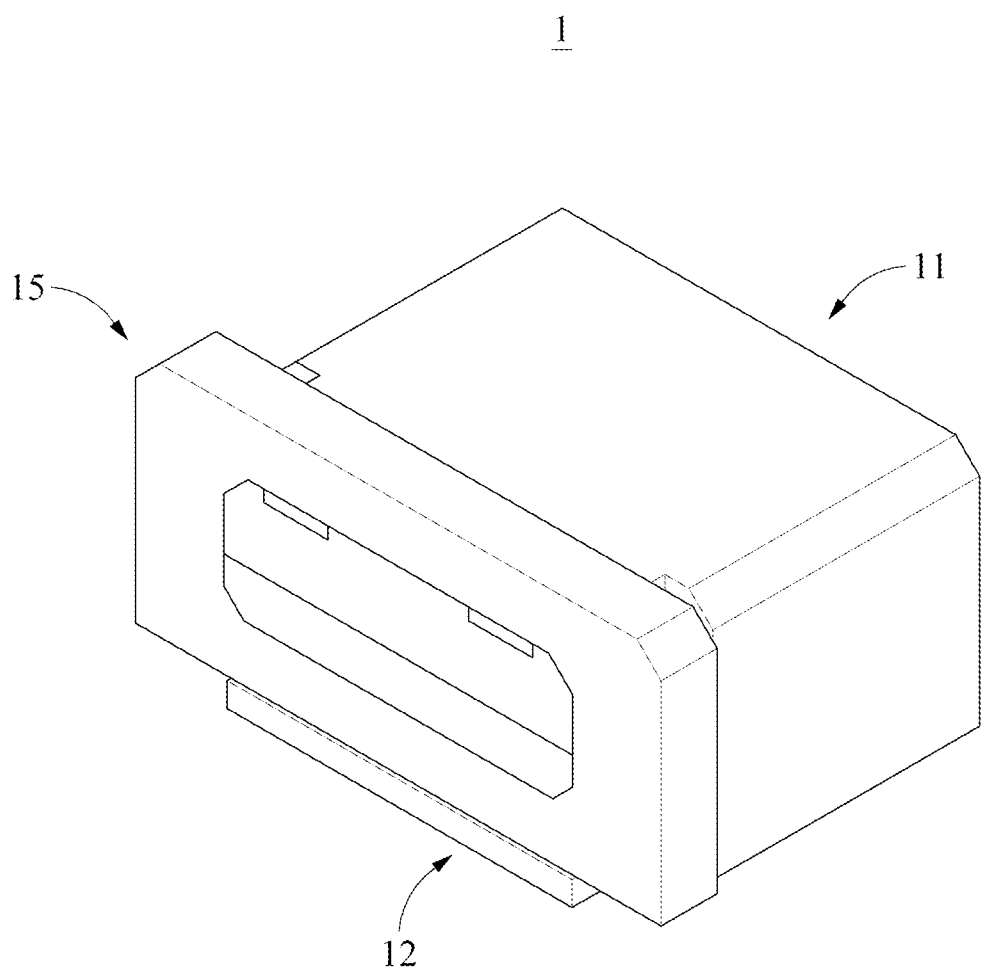
FIG. 2 is a combined perspective view of a substrate processing apparatus according to an example embodiment.

FIG. 1 is an exploded perspective view of a substrate processing apparatus according to an example embodiment. FIG. 2 is a combined perspective view of the substrate processing apparatus according to an example embodiment.

Referring to FIGS. 1 and 2, a substrate processing apparatus 1 may be an apparatus for forming high pressure in a processing space S and processing a substrate. For example, the substrate processing apparatus 1 may be an apparatus for processing the substrate by a supercritical fluid. The substrate processing apparatus 1 may be coupled to a clamp unit 15 to prevent a chamber unit 11 and a door unit 12 from being separated by the high pressure formed inside the processing space S.

Figure 3:
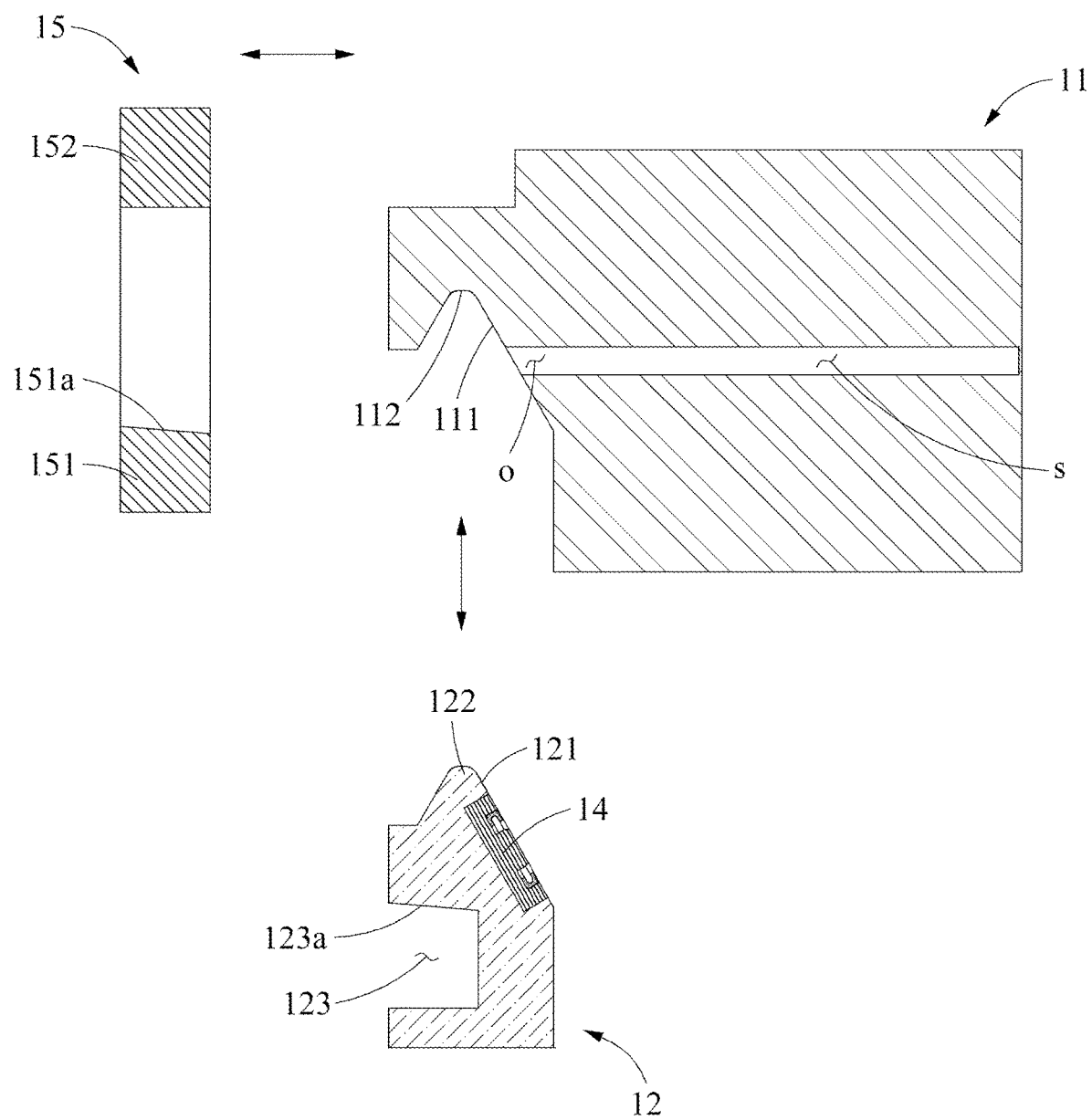
FIG. 3 is an exploded cross-sectional side view of a substrate processing apparatus according to an example embodiment.
Figure 4:
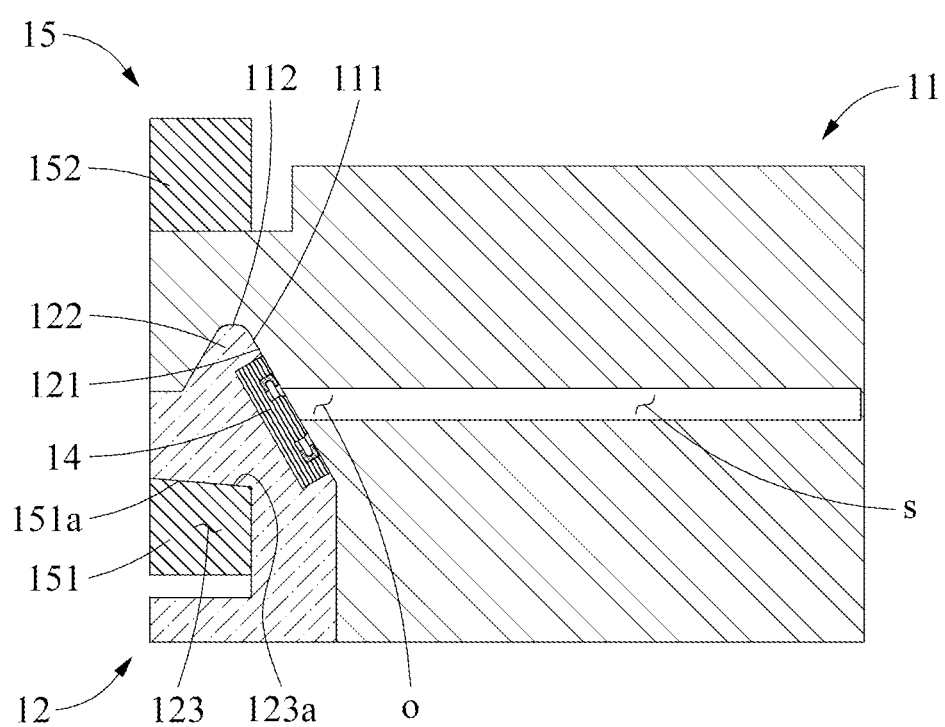
FIG. 4 is a combined cross-sectional side view of a substrate processing apparatus according to an example embodiment.
Figure 5:
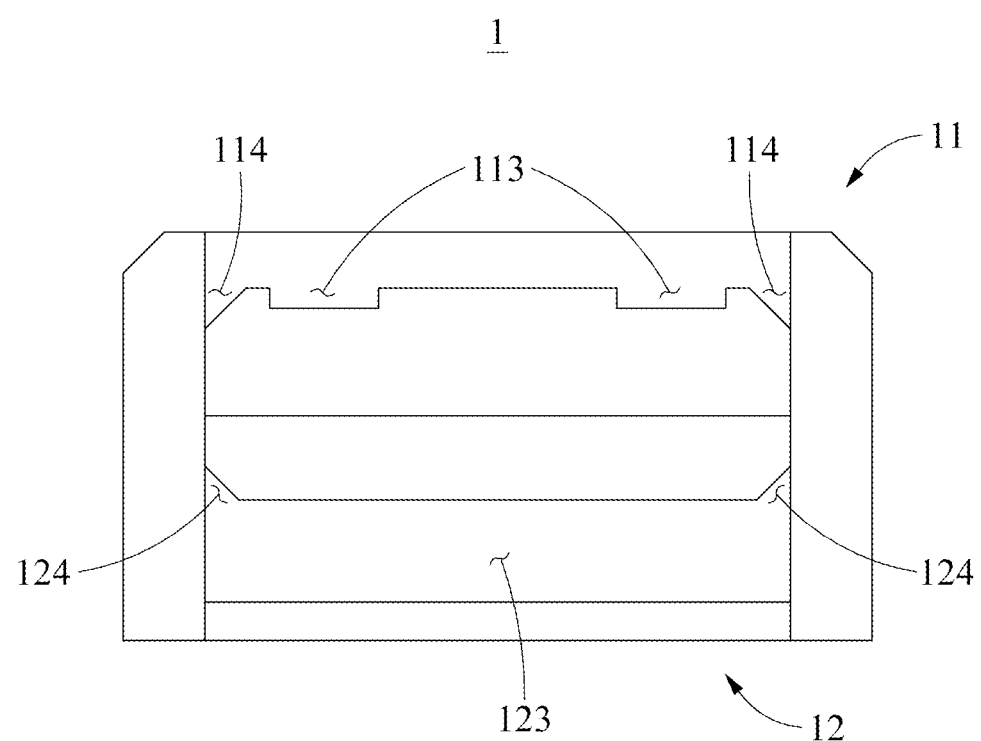
FIG. 5 is a front view of a chamber unit and a door of a substrate processing apparatus according to an example embodiment.
Figure 6:
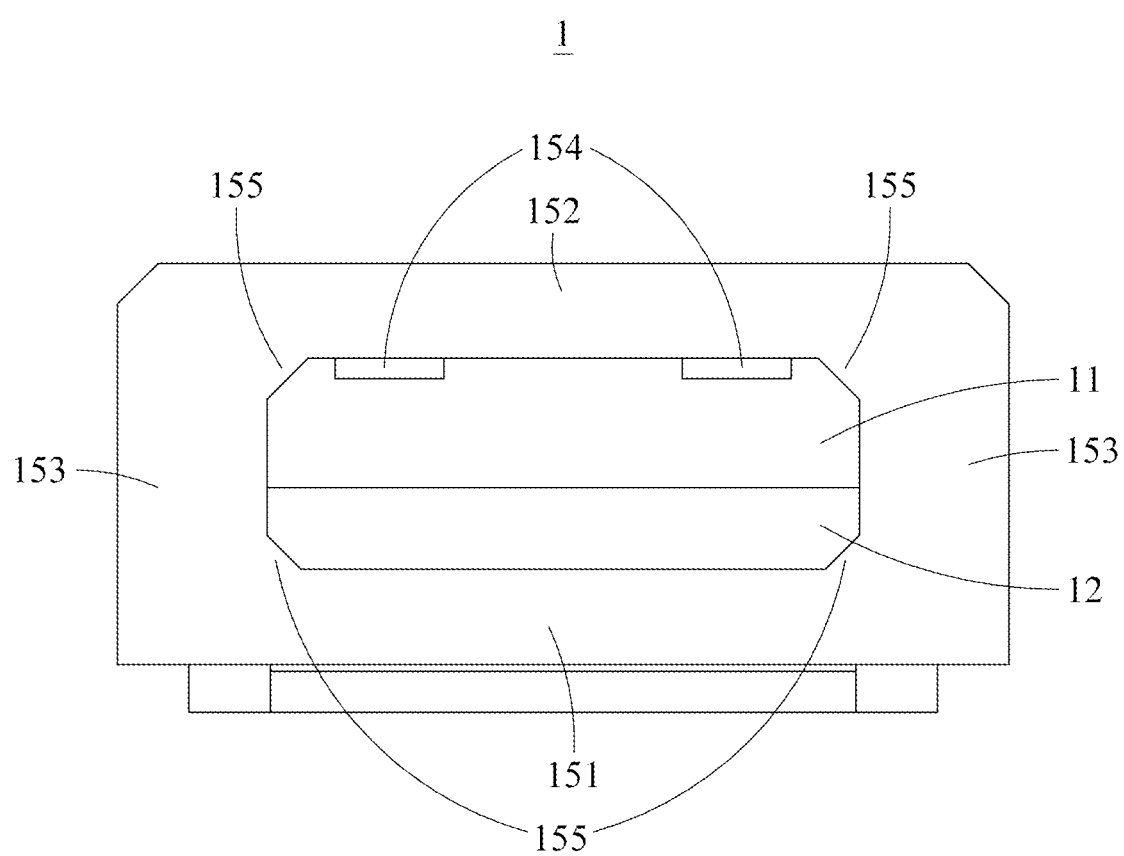
FIG. 6 is a combined front view of a substrate processing apparatus according to an example embodiment.
Figure 7:
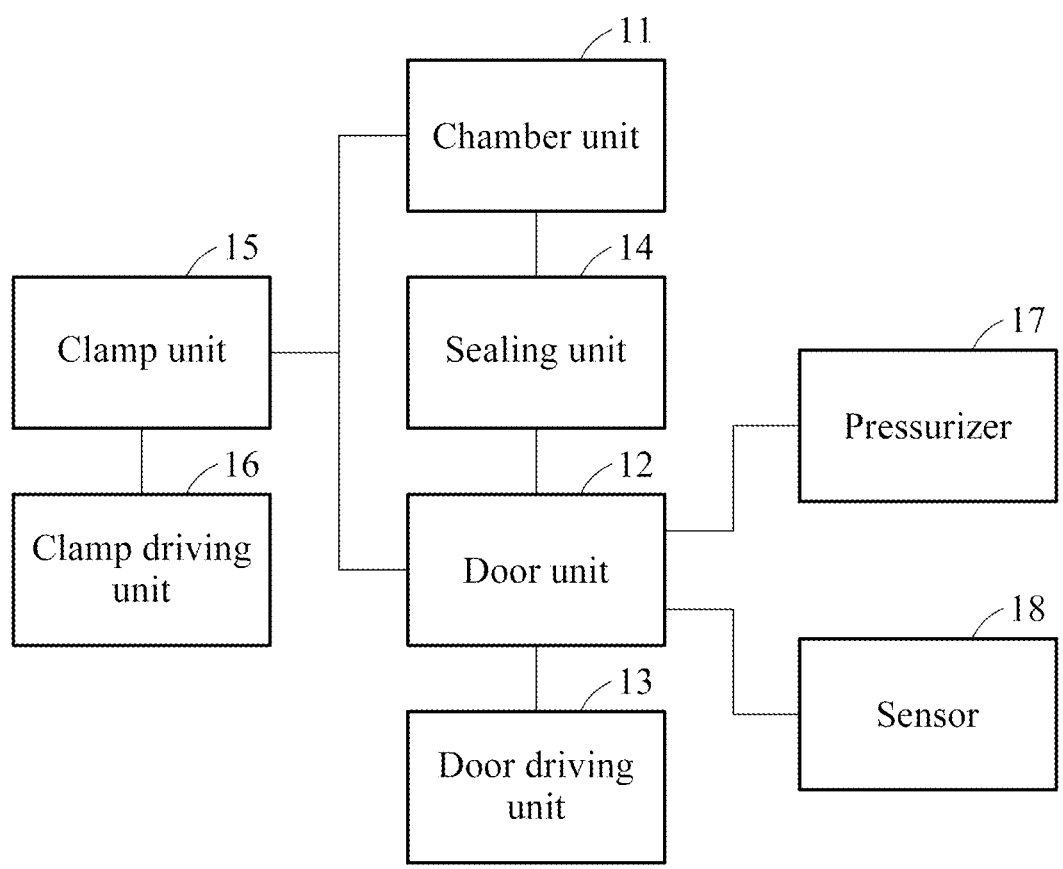
FIG. 7 is a block diagram of a substrate processing apparatus according to an example embodiment.

FIG. 3 is an exploded cross-sectional side view of a substrate processing apparatus according to an example embodiment. FIG. 4 is a combined cross-sectional side view of the substrate processing apparatus according to an example embodiment. FIG. 5 is a front view of a chamber unit and a door of the substrate processing apparatus according to an example embodiment. FIG. 6 is a combined front view of the substrate processing apparatus according to an example embodiment. FIG. 7 is a block diagram of a substrate processing apparatus according to an example embodiment.

Referring to FIGS. 3 to 7, the substrate processing apparatus 1 according to an example embodiment may include the chamber unit 11, the door unit 12, a door driving unit 13, a sealing unit 14, the clamp unit 15, a clamp driving unit 16, and a pressurizer 17.

The processing space S may be provided in the chamber unit 11. In the processing space S, a substrate processing process may be performed. A supercritical fluid may be provided to the processing space S. A seating portion for mounting the substrate may be provided in the processing space S. The chamber unit 11 may include an opening O for loading and unloading the substrate to the processing space S. In addition, one side of the chamber unit 11 may include an inclined chamber surface 111 inclinedly formed. For example, the inclined chamber surface 111 may be inclined in a direction in which an inclined surface thereof faces the ground. The opening O may be formed in the inclined chamber surface 111.

The door unit 12 may be coupled to the chamber unit 11 to open and close the processing space S. When the door unit 12 is coupled to the chamber unit 11, the processing space S and the opening O may be closed. The door unit 12 may include an inclined door surface 121 corresponding to the inclined chamber surface 111. That is, the inclined chamber surface 111 and the inclined door surface 121 may be formed by inclination angles corresponding to each other. When the door unit 12 is coupled to the chamber unit 11, the inclined door surface 121 may contact the inclined chamber surface 111. In other words, when the door unit 12 is coupled to the chamber unit 11, the opening O formed in the inclined chamber surface 111 may be closed as the inclined door surface 121 covers the inclined chamber surface 111.

The door unit 12 may be driven by the door driving unit 13. The door driving unit 13 may move the door unit 12 in parallel to couple the door unit 12 to the chamber unit 11. In other words, by moving the door unit 12 in parallel, the door driving unit 13 may open or close the processing space S. For example, the door driving unit 13 may drive the door unit 12 in the vertical direction. The door driving unit 13 may include a piston, a cylinder, and a motor.

As described above, when a contact portion of the chamber unit 11 and the door unit 12 is formed in an inclined surface, the inclined chamber surface 111 and the inclined door surface 121 may contact each other by vertical driving of the door driving unit 13, and thus, a grinding issue occurring by the contact may be minimized. Accordingly, a particle occurring due to abrasion of a member may be minimized. In addition, since the inclined chamber surface 111 is inclined in a direction toward the ground, even if a particle has generated, an inflow of the particle into the processing space S through the opening O may be prevented. In addition, the contact between the inclined chamber surface 111 and the inclined door surface 121 may collectively include a direct contact as well as an indirect contact. For example, the inclined door surface 121 may indirectly contact the inclined chamber surface 111 through the sealing unit 14 described below.

The chamber unit 11 and the door unit 12 may further include a structure for increasing coupling. An upper surface of the door unit 12 may include a protrusion 122 protruding upward. The chamber unit 11 may include a recess 112 formed in a corresponding shape for inserting the protrusion 122 of the door unit 12. As the door unit 12 moves toward the chamber unit 11 in the vertical direction, the protrusion 122 may be inserted into the recess 112. According to the structure described above, by the high pressure formed inside the processing space S, the door unit 12 may be prevented from being pushed in the horizontal direction (or a front-rear direction) with respect to the chamber unit 11. That is, a movement in the horizontal direction (or the front-rear direction) of the door unit 12 may be restricted as the protrusion 122 and the recess 112 are coupled to each other. Meanwhile, one surface of the protrusion 122 may include at least a portion of the inclined door surface 121. That is, the protrusion 122 may be formed on an extended surface of the inclined door surface 121. The other surface of the protrusion 122 may be inclined in an opposite direction to the inclined door surface 121. Alternatively, the other surface of the protrusion 122 may be formed in the vertical direction.

The sealing unit 14 may maintain sealing of the chamber unit 11 and the door unit 12. The sealing unit 14 may be installed on the contact portion of the chamber unit 11 and the door unit 12 along the circumference of the opening O. For example, the sealing unit 14 may be installed in the inclined door surface 121 of the door unit 12. The sealing unit 14 may also be installed in the inclined chamber surface 111 of the chamber unit 11. The sealing unit 14 may seal the periphery of the opening O when the chamber unit 11 and the door unit 12 are coupled to each other. For example, the sealing unit 14 may include a U-shaped sealing member. The U-shaped sealing member may be disposed to connect a U-shaped space to the processing space S. According to the structure described above, as a supercritical fluid that flowed into the processing space S flows into the U-shaped space of the U-shaped sealing member, the U-shaped sealing member may stretch on both sides and a sealing force may increase. The sealing unit 14 may include an O-ring.

The clamp unit 15 may clamp the chamber unit 11 and the door unit 12 when the chamber unit 11 and the door unit 12 are coupled to each other. The clamp unit 15 may be formed in a frame shape having a hollow inside. The clamp unit 15 may enclose at least a portion of the door unit 12 and the chamber unit 11. That is, the chamber unit 11 and the door unit 12 may be prevented from being separated from each other by inserting at least a portion of the door unit 12 and the chamber unit 11 into the hollow of the clamp unit 15.

The clamp unit 15 may include a lower clamp body 151, an upper clamp body 152, and a side clamp body 153. The lower clamp body 151 may contact the door unit 12. For example, as shown in FIGS. 3 and 4, the lower clamp body 151 may be inserted into a clamp insert groove 123 formed in the door unit 12. Alternatively, the lower clamp body 151 may support the door unit 12 from a lower direction by contacting a lower surface of the door unit 12. The upper clamp body 152 may be disposed on an upper side of the lower clamp body 151 and be apart from the lower clamp body 151. For example, the upper clamp body 152 may support the chamber unit 11 from an up direction by contacting an upper surface of the chamber unit 11. The side clamp body 153 may connect both sides of the lower clamp body 151 to both sides of the upper clamp body 152, respectively. According to the structure described above, the clamp unit 15 may be formed in a frame shape having a hollow inside.

The clamp unit 15 may be driven by the clamp driving unit 16. The clamp driving unit 16 may move the clamp unit 15 in parallel such that the clamp unit 15 is coupled to the chamber unit 11 and the door unit 12. For example, the clamp driving unit 16 may drive the clamp unit 15 in the front-rear direction. The clamp unit 15 may move in a direction approaching the chamber unit 11 and the door unit 12 by the clamp driving unit 16 and at least a portion of the door unit 12 and the chamber unit 11 may be inserted into the hollow inside of the clamp unit 15. The clamp driving unit 16 may include a piston, a cylinder, and a motor.

As described above, when the chamber unit 11 and the door unit 12 are coupled to each other, as the clamp unit 15 encloses at least a portion of the chamber unit 11 and the door unit 12, the chamber unit 11 and the door unit 12 may be prevented from being separated in the vertical direction even if high pressure is formed in the processing space S. That is, by the pressure formed inside the processing space S, the door unit 12 may be prevented from being pushed in the vertical direction (or an up-down direction) with respect to the chamber unit 11. Accordingly, a movement in the vertical direction (or the up-down direction) of the door unit 12 may be restricted.

The door unit 12 may further include a clamp insert groove 123. The clamp insert groove 123 may be a space into which the lower clamp body 151 is inserted. The clamp insert groove 123 may be inwardly recessed from a counter surface of the door unit 12 to a surface of the chamber unit 11. The counter surface to the chamber unit 11 may be a surface that does not contact the chamber unit 11. For example, the clamp insert groove 123 may be formed in a front surface of the door unit 12. As described above, when the clamp insert groove 123 is formed in the door unit 12, the size of the clamp unit 15 may decrease. More particularly, the length in the vertical direction of the clamp unit 15 may be less in the structure in which the lower clamp body 151 is inserted into the clamp insert groove 123 formed in the door unit 12, compared to the structure in which the lower clamp body 151 contacts the lower surface of the door unit 12. Accordingly, as the size of the clamp unit 15 decreases, cost and power may decrease and stability may be secured.

An upper surface 123*a* of the clamp insert groove 123 may be downwardly inclined in a moving direction of the clamp unit 15. Here, the moving direction of the clamp unit 15 may be a direction in which the clamp unit 15 approaches the door unit 12. In addition, an upper surface 151*a* of the lower clamp body 151 may be downwardly inclined in the moving direction of the clamp unit 15 to correspond to the upper surface 123*a* of the clamp insert groove 123. As described above, in case the upper surface 151*a* of the lower clamp body 151 and the upper surface 123*a* of the clamp insert groove 123 are inclined, the lower clamp body 151 may be inserted into the clamp insert groove 123 without a collision even if there is a difference in heights. Accordingly, the clamp unit 15 may improve insertion stability.

Referring to FIGS. 5 and 6, the clamp unit 15 may further include a clamp uneven portion 154 formed on the lower surface of the upper clamp body 152. For example, as shown in FIG. 6, the clamp uneven portion 154 may protrude from the lower surface of the upper clamp body 152. The clamp uneven portion 154 may be recessed in the lower surface of the upper clamp body 152. A plurality of clamp uneven portions 154 may be provided. The chamber unit 11 may include a chamber uneven portion 113 formed on the upper surface of the chamber unit 11 to be coupled to the clamp uneven portion 154. The chamber uneven portion 113 may be formed in a shape and a number corresponding to the clamp uneven portion 154. For example, as shown in FIG. 5, the chamber uneven portion 113 may be recessed in the upper surface of the chamber unit 11. The chamber uneven portion 113 may protrude from the upper surface of the chamber unit 11. A plurality of chamber uneven portions 113 may be provided. When the clamp unit 15 moves toward the chamber unit 11, the clamp uneven portion 154 may be coupled to the chamber uneven portion 113 by being inserted into the chamber uneven portion 113. According to the structure described above, by the high pressure formed inside the processing space S, the chamber unit 11 and the door unit 12 may be prevented from being pushed in a left-right direction.

The clamp unit 15 may further include an inclined connecting part 155. The inclined connecting part 155 may be formed in an inclined surface at a connection portion in which the side clamp body 153 is connected to at least one of the lower clamp body 151 and the upper clamp body 152. In other words, the inclined connecting part 155 may inclinedly connect the side clamp body 153 to a vertical connection portion in which the lower clamp body 151 connects to the upper clamp body 152. At least one of the chamber unit 11 and the door unit 12 may further include inclined chamfers 114 and 124 formed in an inclined surface at a corner thereof for inserting the inclined connecting part 155. Referring to FIG. 5, the chamber unit 11 and the door unit 12 may include the inclined chamfers 114 and 124 respectively at corners. As described above, when the inclined connecting part 155 and the inclined chamfers 114 and 124 are included, the clamp unit 15 may be prevented from colliding with a corner when entering the chamber unit 11 and the door unit 12. Accordingly, the insertion stability of the clamp unit 15 may be improved.

The pressurizer 17 may press the door unit 12 in a constant direction for the chamber unit 11 and the door unit 12 to be in close contact. The pressurizer 17 may be driven while a supercritical processing process is performed. The pressurizer 17, for example, may press the door unit 12 in the front-rear direction. The pressurizer 17 may press the door unit 12 in the vertical direction. As the pressurizer 17 presses the door unit 12 with respect to the chamber unit 11, horizontality and verticality of the door unit 12 may be corrected and a sealing force may increase. In addition, the pressurizer 17 may be integrally formed with the door driving unit 13 as one.

A sensor 18 may measure a coupling state of the door unit 12 and the chamber unit 11. The sensor 18 may measure at least one of a distance and an inclination angle between the door unit 12 and the chamber unit 11, and a pressure applied between the door unit 12 and the chamber unit 11. For example, by measuring at least one of the distance between the door unit 12 and the chamber unit 11, the inclination angle, and the pressure applied between the door unit 12 and the chamber unit 11, the sensor 18 may measure a degree of close contact between the door unit 12 and the chamber unit 11, whether the door unit 12 and the chamber unit 11 are coupled in a regular position, and whether the opening O is closed. Based on a measurement result measured by the sensor 18, an alert may be generated based on a determination that the door unit 12 and the chamber unit 11 do not closely contact each other, the door unit 12 and the chamber unit 11 are not coupled in the regular position, or the opening O is not closed. Specifically, based on the determination that the door unit 12 and the chamber unit 11 do not closely contact each other, the door unit 12 and the chamber unit 11 may closely contact each other by driving the pressurizer 17. Based on the determination that the door unit 12 and the chamber unit 11 are not coupled in the regular position or the opening O is not closed, the door unit 12 and the chamber 11 may be coupled to each other again by driving the door driving unit 13 again. The sensor 18, for example, may include an infrared sensor, a gyro sensor, a touch detection sensor, and a pressure sensor. The sensor 18 may be positioned at the contact portion of the door unit 12 and the chamber unit 11. For example, the sensor 18 may be positioned on the inclined door surface 121 of the door unit 12.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

The invention claimed is:

1. A substrate processing apparatus comprising:
   a chamber unit provided with a processing space therein and comprising an inclined chamber surface having an opening;
   a door unit comprising an inclined door surface, which corresponds to the inclined chamber surface, and configured to be coupled to the chamber unit;
   a door driving unit for driving the door unit so as to open/close the processing space; and
   a clamp unit enclosing at least a portion of the chamber unit and the door unit when the chamber unit is coupled to the door unit,
   wherein the clamp unit comprises:
   a lower clamp body contacting the door unit;
   an upper clamp body disposed on an upper side of the lower clamp body by being spaced apart; and
   a side clamp body for connecting both sides of the lower clamp body to both sides of the upper clamp body.

2. The substrate processing apparatus of claim 1, wherein an upper surface of the door unit comprises a protrusion protruding upward, and
   the chamber unit comprises a recess formed in a corresponding shape for inserting the protrusion.

3. The substrate processing apparatus of claim 2, wherein one surface of the protrusion comprises at least a portion of the inclined door surface.

4. The substrate processing apparatus of claim 1, wherein the door unit comprises a clamp insert groove inwardly recessed in a counter surface to the chamber unit, for inserting the lower clamp body.

5. The substrate processing apparatus of claim 4, wherein an upper surface of the clamp insert groove is downwardly inclined in a moving direction of the clamp unit.

6. The substrate processing apparatus of claim 5, wherein an upper surface of the lower clamp body is downwardly inclined in the moving direction of the clamp unit to correspond to the upper surface of the clamp insert groove.

7. The substrate processing apparatus of claim 1, wherein the clamp unit comprises a clamp uneven portion formed on a lower surface of the upper clamp body.

8. The substrate processing apparatus of claim 7, wherein the chamber unit comprises a chamber uneven portion formed on an upper surface of the chamber unit to be coupled to the clamp uneven portion.

9. The substrate processing apparatus of claim 1, wherein the clamp unit comprises an inclined connecting part formed in an inclined surface at a connection portion in which the side clamp body is connected to at least one of the lower clamp body and the upper clamp body.

10. The substrate processing apparatus of claim 9, wherein at least one of the door unit and the chamber unit comprises an inclined chamfer formed in an inclined surface at a corner, for inserting the inclined connecting part.

11. The substrate processing apparatus of claim 1, further comprising:
   a sealing unit installed in a contact portion of the door unit and the chamber unit along a circumference of the opening.

12. The substrate processing apparatus of claim 11, wherein the sealing unit comprises a U-shaped sealing member and is disposed to connect a U-shaped space to the processing space.

13. The substrate processing apparatus of claim 1, wherein the door driving unit drives the door unit in a vertical direction.

14. The substrate processing apparatus of claim 1, further comprising:
   a clamp driving unit for driving the clamp in a front-rear direction.

* * * * *